(12) United States Patent
Di et al.

(10) Patent No.: US 12,062,744 B2
(45) Date of Patent: Aug. 13, 2024

(54) DISPLAY SUBSTRATE, DISPLAY DEVICE AND METHOD FOR MANUFACTURING A DISPLAY SUBSTRATE

(71) Applicant: BOE TECHNOLOGY GROUP CO., LTD., Beijing (CN)

(72) Inventors: Muxin Di, Beijing (CN); Ke Wang, Beijing (CN); Guoqiang Wang, Beijing (CN); Zhiwei Liang, Beijing (CN); Renquan Gu, Beijing (CN); Yingwei Liu, Beijing (CN); Qi Yao, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 949 days.

(21) Appl. No.: 16/975,771

(22) PCT Filed: Oct. 12, 2019

(86) PCT No.: PCT/CN2019/110779
§ 371 (c)(1),
(2) Date: Aug. 26, 2020

(87) PCT Pub. No.: WO2021/068233
PCT Pub. Date: Apr. 15, 2021

(65) Prior Publication Data
US 2023/0101638 A1    Mar. 30, 2023

(51) Int. Cl.
*H01L 33/62* (2010.01)
*H01L 33/00* (2010.01)
*H01L 33/38* (2010.01)

(52) U.S. Cl.
CPC ............ *H01L 33/62* (2013.01); *H01L 33/005* (2013.01); *H01L 33/387* (2013.01); *H01L 2933/0016* (2013.01); *H01L 2933/0066* (2013.01)

(58) Field of Classification Search
CPC ..... H01L 33/62; H01L 33/005; H01L 33/387; H01L 2933/0016; H01L 2933/0066; H01L 27/1218; H01L 27/1266; H01L 27/124
See application file for complete search history.

(56) References Cited

U.S. PATENT DOCUMENTS

2014/0175393 A1*   6/2014   Beak .................. H10K 59/1216
                                                                257/40
2018/0247994 A1*   8/2018   Seo ...................... H01L 27/1218
(Continued)

FOREIGN PATENT DOCUMENTS

CN         104460147 A      3/2015
CN         107342299 A     11/2017
(Continued)

OTHER PUBLICATIONS

European Extended Search Report, Application No. 19944648.5, dated Jun. 20, 2022, 7 pps.
(Continued)

*Primary Examiner* — Ratisha Mehta
(74) *Attorney, Agent, or Firm* — Armstrong Teasdale LLP

(57) ABSTRACT

The present disclosure relates to a display substrate, a display device, and a method for manufacturing a display substrate. The display substrate includes a base substrate having a first side and a second side opposite to the first side, a via provided in the base substrate, a thin film transistor provided on the first side of the base substrate, a first conductive structure provided on the first side of the base substrate, wherein a first sub-portion of the first conductive structure is located in the via, and wherein a material of the first conductive structure is the same as a material of a source/drain electrode of the thin film transistor.

17 Claims, 13 Drawing Sheets

(56) References Cited

U.S. PATENT DOCUMENTS

| | | | |
|---|---|---|---|
| 2019/0035870 A1* | 1/2019 | Park | .................... H01L 27/1255 |
| 2019/0067332 A1 | 2/2019 | Liu et al. | |
| 2019/0271873 A1 | 9/2019 | Yabuki et al. | |
| 2020/0136068 A1* | 4/2020 | Lee | ...................... H10K 71/233 |

FOREIGN PATENT DOCUMENTS

| | | |
|---|---|---|
| CN | 108511487 A | 9/2018 |
| CN | 109904080 A | 6/2019 |
| CN | 110310575 A | 10/2019 |
| JP | 2015072361 A | 4/2015 |
| WO | 2018223696 A1 | 12/2018 |

OTHER PUBLICATIONS

PCT International Search Report, Application No. PCT/CN2019/110779, dated Jul. 9, 2020, 7 pages: with English translation.
PCT Written Opinion, Application No. PCT/CN2019/110779, dated Jul. 9, 2020, 6 pages.: with English translation of relevant part.

* cited by examiner

DISPLAY SUBSTRATE, DISPLAY DEVICE AND METHOD FOR MANUFACTURING A DISPLAY SUBSTRATE

CROSS REFERENCE TO RELATED APPLICATIONS

This patent application is a National Stage Entry of PCT/CN2019/110779 filed on Oct. 12, 2019, the disclosure of which is incorporated by reference herein in its entirety as part of the present application.

BACKGROUND

Embodiments of the present disclosure relate to a field of displaying technology, in particular, to a display substrate, a display device, and a method for manufacturing a display substrate.

Full-screen technology has gradually become the mainstream technology for handheld devices such as mobile phones. Currently, Gate Driver On Array (GOA) technology is used to narrow left and right frames. A Chip On Film (COF) technology is used to narrow a bottom frame. However, there is still an area on the front of the display screen that cannot be work as a display area, thereby a better narrow bezel or bezel free effect cannot be achieved.

BRIEF DESCRIPTION

Some embodiments of the present disclosure provide a display substrate. The display substrate includes a base substrate having a first side and a second side opposite to the first side, a via provided in the base substrate, a thin film transistor arranged on the first side of the base substrate, a first conductive structure provided on the first side of the base substrate, wherein a first sub-portion of the first conductive structure is located in the via, and wherein a material of the first conductive structure is the same as a material of a source/drain electrode of the thin film transistor.

In some embodiments, the display substrate further includes a first conductive part, the first conductive part is at least partially located in the via and directly contacts the first sub-portion of the first conductive structure.

In some embodiments, a surface of the first conductive part away from the first side of the base substrate is coplanar with the second side.

In some embodiments, the display substrate further includes a first dielectric layer located between the base substrate and the first conductive part, wherein a surface of the first dielectric layer away from the base substrate being coplanar with the second side.

In some embodiments, the display substrate further includes an intermediate layer, a first opening penetrating the intermediate layer and communicating with the via, wherein a second sub-portion of the first conductive structure at least partially covers a sidewall of the first opening, and wherein a third sub-portion of the first conductive structure is located on a surface of the intermediate layer away from the base substrate.

In some embodiments, the source/drain electrode of the thin film transistor is provided in a same layer as at least the third sub-portion of the first conductive structure.

In some embodiments, the display substrate further includes a light emitting element including a first electrode and a second electrode, wherein one of the first electrode and the second electrode is electrically connected to the source/drain electrode.

In some embodiments, the display substrate further includes a second dielectric layer, wherein the second dielectric layer covers the source/drain electrode and the first conductive structure.

In some embodiments, the display substrate further includes a second conductive part, wherein the second conductive part is electrically connected to the source/drain electrode through a via located in the second dielectric layer.

In some embodiments, the display substrate further includes a third dielectric layer, wherein the third dielectric layer covers at least a side surface of the second conductive part.

In some embodiments, the display substrate further includes a light shielding pattern located on a side of the third dielectric layer away from the base substrate, and an orthographic projection of the light shielding pattern on the base substrate at least covering an orthographic projection of the first conductive part on the base substrate.

In some embodiments, the display substrate further includes an integrated circuit provided on the second side of the base substrate, wherein the integrated circuit is electrically connected to the first conductive part.

Embodiments of the present disclosure further provide a display device. The display device includes the display substrate as described above.

Embodiments of the present disclosure further provide a method for manufacturing a display substrate. The method for manufacturing the display substrate includes providing a base substrate, forming a via in the base substrate, forming a first conductive structure and a thin film transistor on a first side of the base substrate, wherein a first sub-portion of the first conductive structure is located in the via, and the first conductive structure and a source/drain electrode of the thin film transistor are manufactured by a single film forming process.

In some embodiments, providing the base substrate includes providing a supporting substrate, providing a sacrificial layer on the supporting substrate, forming a first conductive part on the sacrificial layer, forming a first dielectric layer to cover the first conductive part and the sacrificial layer, and applying a first material on the first dielectric layer to form the base substrate.

In some embodiments, the method for manufacturing the display substrate further includes forming an intermediate layer on the base substrate, wherein forming the via in the base substrate includes forming a hole passing through the intermediate layer and the base substrate to expose a surface of the first conductive part.

In some embodiments, forming the first conductive structure includes forming a conductive material layer on the intermediate layer, and performing a patterning process on the conductive material layer to form the first conductive structure and a source/drain electrode.

BRIEF DESCRIPTION OF THE DRAWINGS

In order to explain the technical solutions of the embodiments of the present disclosure more clearly, the drawings of the embodiments will be briefly described below. It should be understood that the drawings described below only relate to some embodiments of the present disclosure, instead of being a limit to the present disclosure, in which.

DETAILED DESCRIPTION

Figure 1:
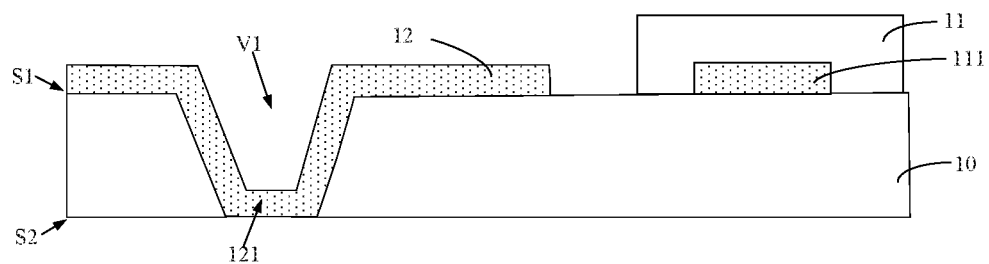
FIG. 1 is a schematic view of a display substrate according to an embodiment of the present disclosure.

In order to make the technical solutions and advantages of the embodiments of the present disclosure clearer, the technical solutions of the embodiments of the present disclosure will be described clearly and completely in conjunction with the accompanying drawings. Obviously, the described embodiments are part of the embodiments of the present disclosure, rather than all of the embodiments. Based on the described embodiments of the present disclosure, all other embodiments obtained by those skilled in the art without creative labor are also belonging to the protection scope of the present disclosure.

When the elements and the embodiments thereof of the present application are introduced, the articles "a/an", "one", "the" and "said" are intended to represent the existence of one or more elements. The expressions "comprise", "include", "contain" and "have" are intended as inclusive and mean that there may be other elements besides those listed.

For purposes of the description hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected with or without any additional elements at the interface of the two elements.

FIG. 1 is a schematic view of a display substrate according to an embodiment of the present disclosure. As shown in FIG. 1, a display substrate according to an embodiment of the present disclosure includes a base substrate 10 having a first side S1 and a second side S2 opposite to the first side S1, a via V1 provided in the base substrate 10, a thin film transistor 11 provided on the first side S1 of the base substrate 10, a first conductive structure 12 provided on the first side S1 of the base substrate 10, wherein a first sub-portion 121 of the first conductive structure 12 is located in the via V1. In an embodiment of the present disclosure, a material of the first conductive structure 12 may be the same as a material of a source/drain electrode 111 of the thin film transistor. An orthographic projection of the via V1 of the thin film transistor 11 on the base substrate 10 does not overlap with an orthographic projection of the via V1 on the base substrate 10.

Through some embodiments of the present disclosure, a bezel free or narrow bezel display substrate can be realized. For example, a circuit, etc. may be provided on the back side (e.g., the second side) of the display substrate. The area of the effective display area can be increased, and the display quality can be improved.

Figure 2:
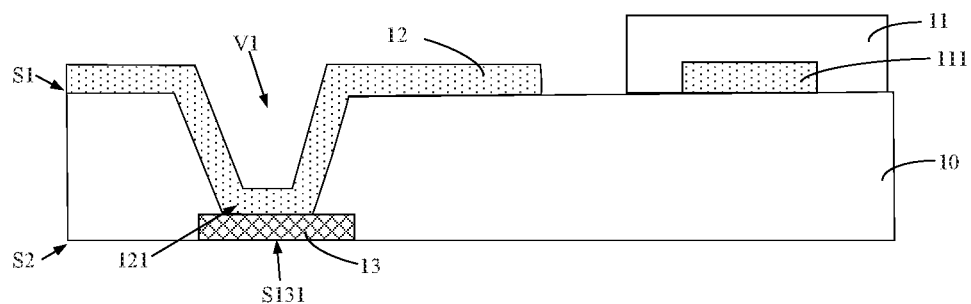
FIG. 2 is a schematic view of a display substrate according to an embodiment of the present disclosure.

FIG. 2 is a schematic view of a display substrate according to an embodiment of the present disclosure. As shown in FIG. 2, the display substrate according to an embodiment of the present disclosure further includes a first conductive part 13. As shown in FIG. 2, the first conductive part 13 is at least partially located in the via V1 and directly contacts the first sub-portion 121 of the first conductive structure 12. The first conductive part 13 may provide an electrical connection to the first conductive structure 12. According to an embodiment of the present disclosure, the first conductive part 13 may at least partially cover a sidewall of the via V1.

In some embodiments, a surface S131 of the first conductive part 13 away from the first side S1 of the base substrate 10 is coplanar with the second side S2. The first conductive part 13 may include a single layer or a stacked-layers structure. For example, the first conductive part may include at least one of Ti/Al/Ti stacked layers or Cu.

The base substrate 10 may include a flexible base substrate. For example, the base substrate 10 may include a polymide (PI) base substrate.

Figure 3:
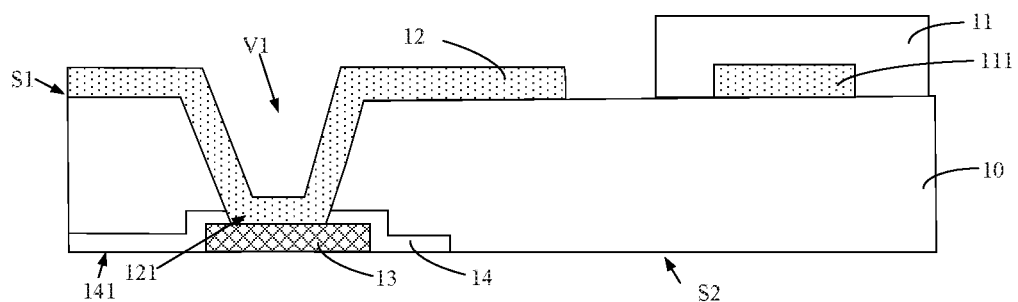
FIG. 3 is a schematic view of a display substrate according to an embodiment of the present disclosure.

FIG. 3 is a schematic view of a display substrate according to an embodiment of the present disclosure. As shown in FIG. 3, the display substrate according to an embodiment of the present disclosure may further include a first dielectric layer 14 located between the base substrate 10 and the first conductive part 13. As shown in the figure, a surface S141 of the first dielectric layer 14 away from the first side S1 of the base substrate 10 is coplanar with the second side S2. The first dielectric layer 14 may be used as a passivation layer. For example, the first dielectric layer 14 may include silicon nitride (SiNx).

Figure 4:
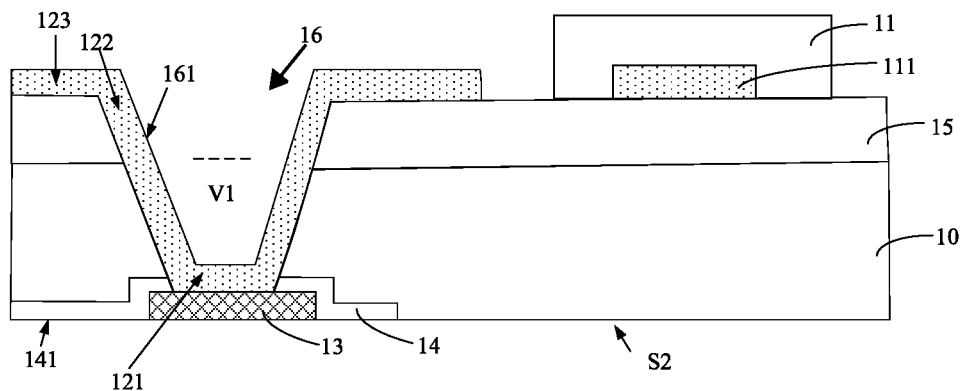
FIG. 4 is a schematic view of a display substrate according to an embodiment of the present disclosure.

FIG. 4 is a schematic view of a display substrate according to an embodiment of the present disclosure. As shown in FIG. 4, the display substrate according to an embodiment of the present disclosure may further include an intermediate layer 15 and a first opening 16. The intermediate layer 15 may be located between the base substrate 10 and the first conductive structure 12. It can be seen from FIG. 4 that the first opening 16 penetrates the intermediate layer 15 and communicates with the via V1. A second sub-portion 122 of the first conductive structure 12 may at least partially cover a sidewall 161 of the first opening 16. A third sub-portion 123 of the first conductive structure 12 is located on a surface of the intermediate layer 15 away from the base substrate 10.

In some embodiments, the source/drain electrode 111 of the thin film transistor may be provided at least in the same layer as the third sub-portion 123 of the first conductive structure 12. The expression "provided in the same layer" herein can also be referred to be formed from a same film layer.

Figure 5:
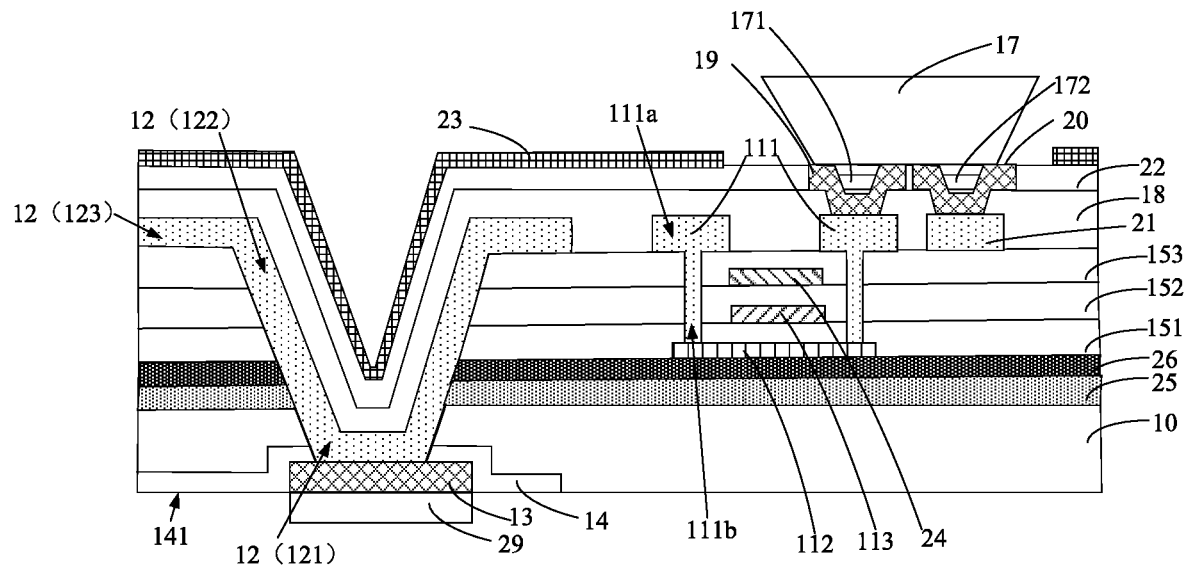
FIG. 5 is a schematic view of a display substrate according to an embodiment of the present disclosure.

FIG. 5 is a schematic view of a display substrate according to an embodiment of the present disclosure. As shown in FIG. 5, the display substrate according to the embodiment of the present disclosure may further include a light emitting element 17. The light emitting element 17 may include a first electrode 171 and a second electrode 172, wherein one of the first electrode 171 and the second electrode 172 is electrically connected to the source/drain electrode 111. FIG. 5 exemplifies that the first electrode 171 is electrically connected to the source/drain electrode 111. It can be understood that the positions of the first electrode 171 and the second electrode 172 can be interchanged. The first electrode 171 may be one of a positive electrode and a negative electrode, and the second electrode 172 may be the other of the positive electrode and the negative electrode.

In some embodiments, the display substrate may further include a second dielectric layer 18. The second dielectric layer 18 may cover the source/drain electrode 111 and the first conductive structure 12. In some embodiments, the display substrate may further include a second conductive part 19. The second dielectric layer 18 may have a first hole exposing the source/drain electrode 111. The second conductive part 19 may be electrically connected to the source/drain electrode 111 through the first hole located in the second dielectric layer 18.

In some embodiments, the display substrate may further include a third conductive part 20 and a fourth conductive part 21. As shown in FIG. 5, the fourth conductive part 21 may be located on a side of the intermediate layer 15 away from the base substrate 10. The fourth conductive part 21 may include the same material as the source/drain electrode 111. In some embodiments, the fourth conductive part 21 may be provided in the same layer as the source/drain electrode 111, i.e., both may be formed from the same film layer. The second dielectric layer 18 may further have a second hole exposing the fourth conductive part 21. The third conductive part 20 may be electrically connected to the fourth conductive part 21 through the second hole. With such arrangement, display signals can be conveniently provided to the light emitting element 17.

In some embodiments, a third dielectric layer 22 is further included. The third dielectric layer 22 covers at least a side surface of the second conductive part 19. The third dielectric layer 22 can prevent the side surface of the second conductive part 19 from being oxidized. It can be seen from FIG. 5 that the third dielectric layer 22 is located on a side of the second dielectric layer 18 away from the base substrate 10.

In some embodiments, the display substrate further includes a light shielding pattern 23. The light shielding pattern 23 may be located on a side of the third dielectric layer 22 away from the base substrate. An orthographic projection of the light shielding pattern 23 on the base substrate 10 at least covers an orthographic projection of the first conductive part 13 on the base substrate 10. The light shielding pattern 23 can block the undesired incident or reflection of light and can improve the display effect.

In some embodiments, the intermediate layer 15 may include a first sub-dielectric layer 151 and a second sub-dielectric layer 152 sequentially provided on the first side of the base substrate 10 in a direction away from the base substrate 10. The source/drain electrode 111 of the thin film transistor includes a first portion 111a located on the side of the intermediate layer 15 away from the base substrate 10 and a second portion 111b passing through at least a portion of the intermediate layer 15 to reach an active layer 112. The first sub-dielectric layer 151 covers the active layer 112 and serves as a gate dielectric layer of the thin film transistor. A gate electrode 113 is located on a side of the first sub-dielectric layer 151 away from the base substrate 10 and is covered by the second sub-dielectric 152.

The intermediate layer 15 may further include a third sub-dielectric layer 153 provided on a side of the second sub-dielectric layer 152 away from the base substrate 10. The display substrate further includes a conductive structure 24 located on the side of the second sub-dielectric layer 152 away from the base substrate 10 and covered by the third sub-dielectric 153. An orthographic projection of the conductive structure 24 on the base substrate 10 at least partially overlaps with an orthographic projection of the gate electrode 113 on the base substrate 10. The conductive structure 24 may form a storage capacitor together with the gate electrode 113.

Figure 6:
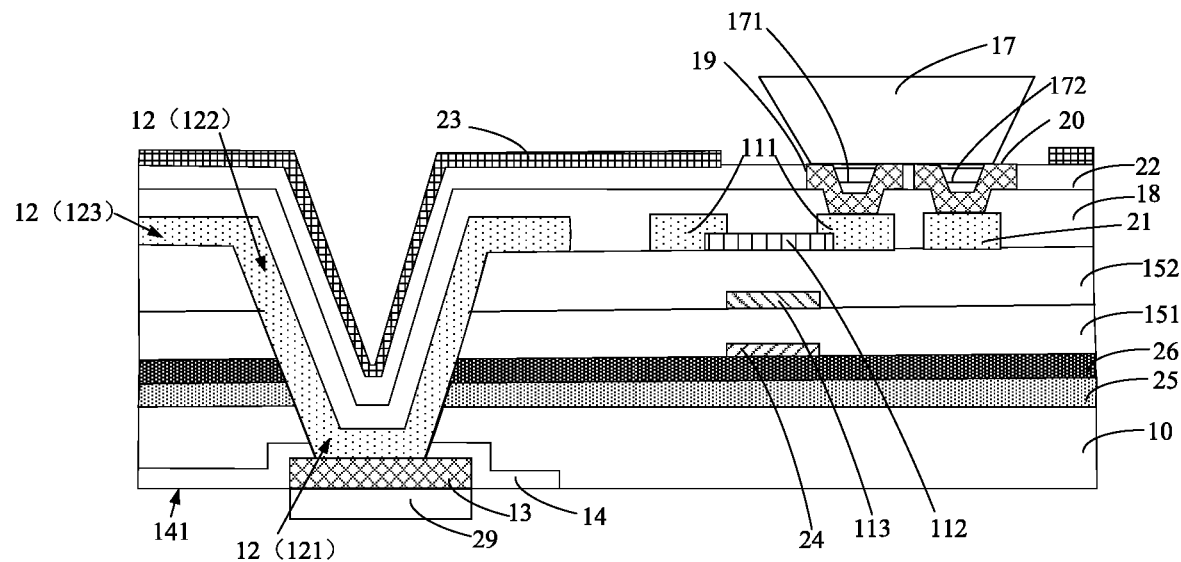
FIG. 6 is a schematic view of a display substrate according to an embodiment of the present disclosure.

FIG. 6 is a schematic view of a display substrate according to an embodiment of the present disclosure. As shown in FIG. 6, the intermediate layer 15 may include a first sub-dielectric layer 151 and a second sub-dielectric layer 152 sequentially provided on the first side of the base substrate 10 in a direction away from the base substrate 10. The second sub-dielectric layer 152 may be used as a gate dielectric layer. The first sub-dielectric layer 151 and the second sub-dielectric layer 152 may include at least one of silicon oxide and silicon nitride. The gate electrode 113 may be located on a side of the first sub-dielectric layer 151 away from the base substrate 10 and covered by the second sub-dielectric layer 152. An active layer 112 is located on a side of the second sub-dielectric layer 152 away from the base substrate 10. The display substrate may further include a conductive structure 24 located on the base substrate 10 and covered by the first sub-dielectric layer 151. An orthographic projection of the conductive structure 24 on the base substrate 10 at least partially overlaps with an orthographic projection of the gate electrode 113 on the base substrate 10, thereby forming a storage capacitor together with the gate electrode 113.

In some embodiments, as shown in FIGS. 5 and 6, the display substrate may further include a barrier layer 25 and a buffer layer 26 located between the base substrate 10 and the first sub-dielectric layer 151 and sequentially provided in a direction away from the base substrate 10. The barrier layer 25 may include silicon oxide (SiOx). The buffer layer 26 may include at least one of silicon oxide (SiOx) or silicon nitride (SiNx).

The buffer layer and the barrier layer can prevent heat from spreading. In this way, on one hand, the influence of heat on the underlying material can be prevented, and on the other hand, the temperature for the crystallization process for the active layer can be maintained. The barrier layer 26 may include at least one of silicon oxide and silicon nitride. The buffer layer can further prevent impurities from entering into the active layer to avoid affecting the characteristics of the thin film transistor.

In some embodiments, the display substrate may further include an integrated circuit 29 located on the second side of the base substrate 10 opposite to the first side. The integrated circuit 29 is electrically connected to the first conductive part 13. The integrated circuit 29 can be used to input/output electrical signals to the display substrate.

Figure 7:
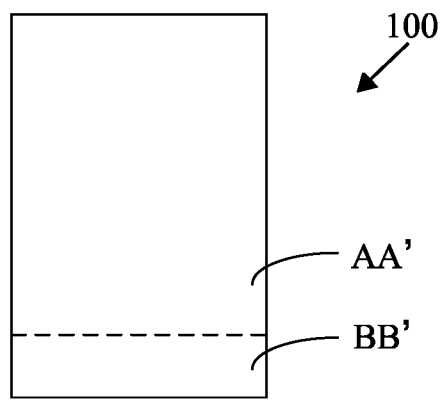
FIG. 7 is a schematic top view of a display substrate according to an embodiment of the present disclosure.

FIG. 7 is a schematic top view of a display substrate according to an embodiment of the present disclosure. An area AA' of a display substrate 100 according to some embodiments of the present disclosure is a display area. An area BB' may also be a display area. In the conventional technology, the area BB' is the bezel area of the display substrate in which wirings, etc., need to be provided and displaying cannot be realized. However, in the embodiments of the present disclosure, the BB' area can simultaneously realize the functions of wiring (that is, used as a bonding area) and displaying. Therefore, the embodiments of the present disclosure can realize a bezel free or narrow bezel display substrate. For example, a circuit, etc. can be provided on the back side (e.g., the second side) of the display substrate, which solves a problem of the circuit occupying an effective display area. The area of the effective display area can be increased, and the display quality can be improved.

The embodiments of the present disclosure further provides a display device.

Figure 8:
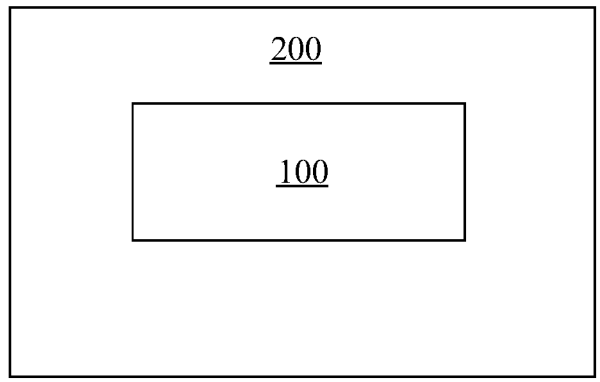
FIG. 8 is a schematic view of a splicing display device according to an embodiment of the present disclosure.

FIG. 8 is a schematic view of a display device according to an embodiment of the present disclosure. As shown in FIG. 8, the display device 200 according to an embodiment of the present disclosure includes the display substrate 100 as described above. It should be understood that although the drawings only show the case where the display device 200 includes one display substrate 100, the display device 200 may further include a plurality of display substrates 100 spliced together.

Figure 9:
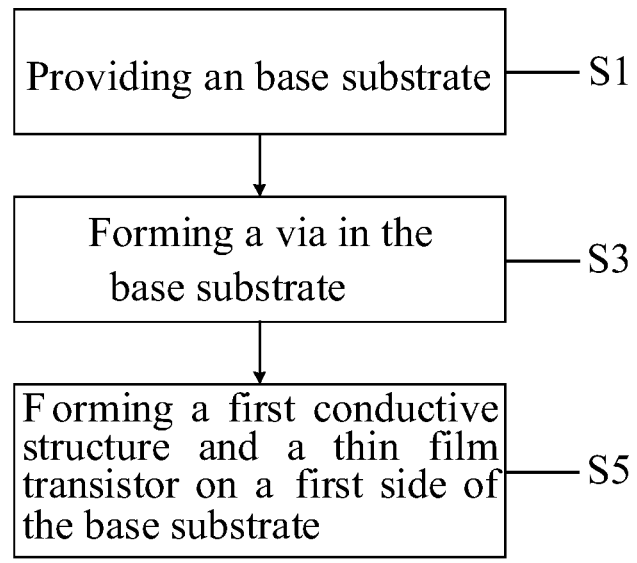
FIG. 9 is a schematic view of a flowchart of a method for manufacturing a display substrate according to an embodiment of the present disclosure.

The embodiments of the present disclosure further provide a method for manufacturing a display substrate. FIG. 9 is a schematic view of a flowchart of a method for manufacturing a display substrate according to an embodiment of the present disclosure. As shown in FIG. 9, a method for manufacturing a display substrate according to an embodiment of the present disclosure includes:

S1, providing an base substrate;
S3, forming a via in the base substrate; and
S5, forming a first conductive structure and a thin film transistor on a first side of the base substrate, wherein a first sub-portion of the first conductive structure is located in the via, and the first conductive structure and a source electrode and a drain electrode of the thin film transistor are manufactured by a single film forming process, in other words, are formed from the same film layer by a single patterning process.

FIGS. 10A-10E are schematic views of a method for manufacturing a display substrate according to an embodiment of the present disclosure.

Figure 10A:
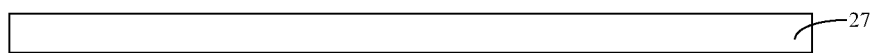
FIGS. 10A-10E are schematic views of a method for manufacturing a display substrate according to an embodiment of the present disclosure.

As shown in FIG. 10A, a supporting substrate 27 is provided. The supporting substrate may be glass, for example.

Figure 10B:
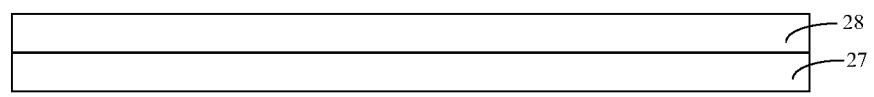

As shown in FIG. 10B, a sacrificial layer (De-bonding layer, DBL) 28 is provided on the supporting substrate 27. The sacrificial layer may include PI-like material.

Figure 10C:
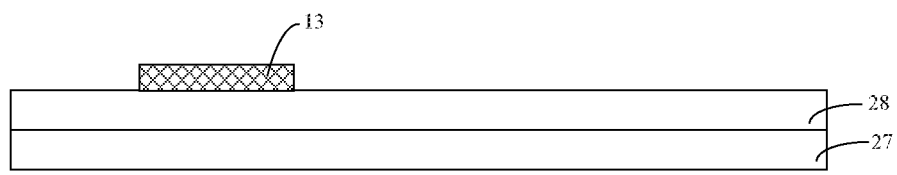

As shown in FIG. 10C, a first conductive part 13 is formed on the sacrificial layer 28.

Figure 10D:
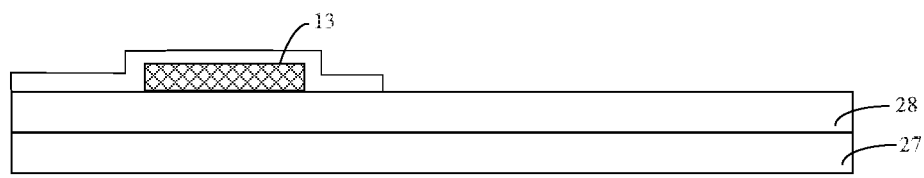

As shown in FIG. 10D, a first dielectric layer 14 is formed to cover the first conductive part 13 and the sacrificial layer 28.

Figure 10E:
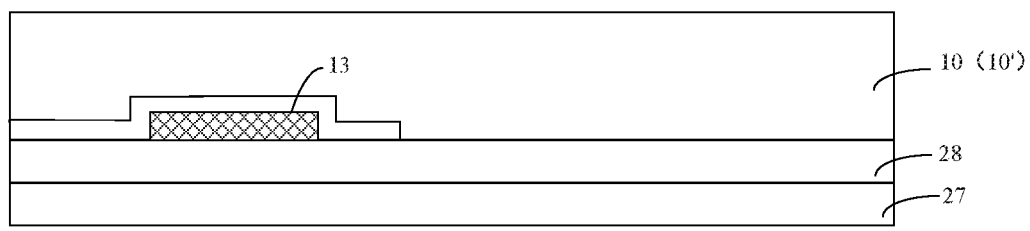

As shown in FIG. 10E, a first material 10' is coated on the first dielectric layer 14 to form a base substrate 10. For example, the base substrate can be formed by coating liquid polyimide followed by curing.

In some embodiments, as shown in FIG. 4, the method for manufacturing a display substrate may further include forming an intermediate layer 15 on the base substrate 10. Forming a via in the base substrate may include forming a hole passing through the intermediate layer 15 and the base substrate 10 to expose a surface of the first conductive part 13. Forming the first conductive structure may include forming a conductive material layer on the intermediate layer, and performing a patterning process on the conductive material layer to form the first conductive structure and a source/drain electrode.

FIGS. 11A-11J are schematic views of a method for manufacturing a display substrate according to an embodiment of the present disclosure.

Figure 11A:
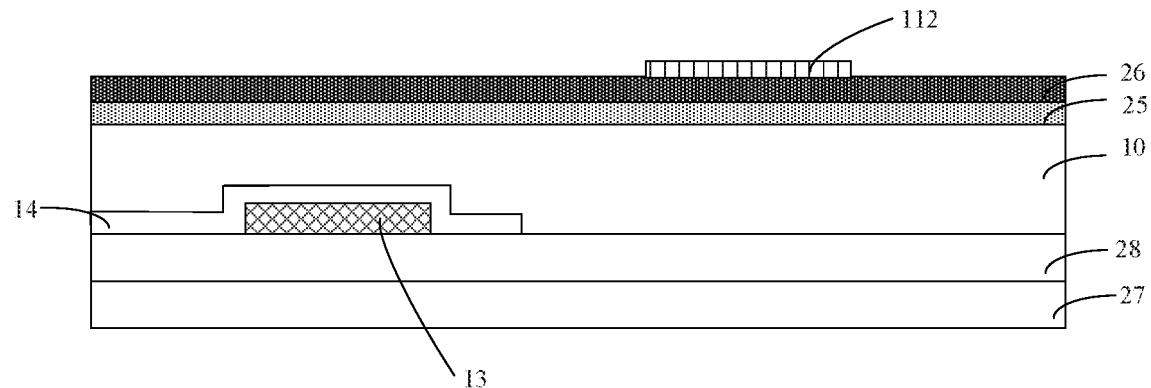
FIGS. 11A-11J are schematic views of a method for manufacturing a display substrate according to an embodiment of the present disclosure.

As shown in FIG. 11A, the method for manufacturing a display substrate according to an embodiment of the present disclosure may include forming a sacrificial layer 28 on a supporting substrate 27, forming a first conductive part 13 on the sacrificial layer 28, forming a first dielectric layer 14 on the first conductive part 13 to cover the first conductive part 13, forming a base substrate 10 on the first dielectric layer 14, forming a barrier layer 25 on the base substrate 10, forming a buffer layer 26 on the barrier layer 25, and forming an active layer 112 on the buffer layer 26. The buffer layer and the barrier layer can prevent heat from spreading. In this way, on one hand, the influence of heat on the underlying material can be prevented, and on the other hand, the temperature for the crystallization process for the active layer can be maintained. The barrier layer 26 may include at least one of silicon oxide and silicon nitride. The buffer layer can further prevent impurities from entering into the active layer to avoid affecting the characteristics of the thin film transistor.

Figure 11B:
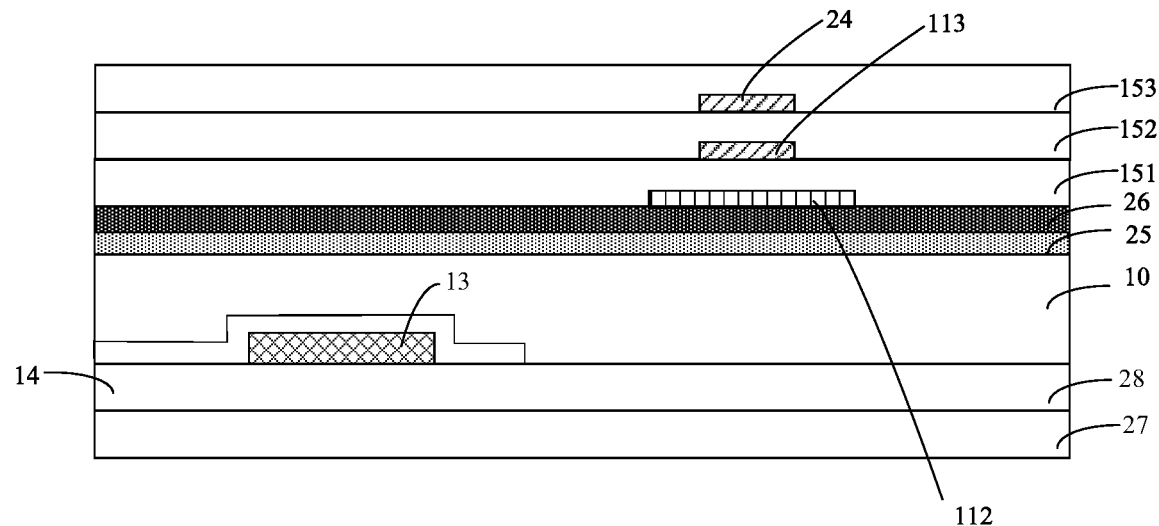

As shown in FIG. 11B, the method for manufacturing a display substrate according to an embodiment of the present disclosure may further include forming a first sub-dielectric layer 151 on the active layer 112, forming a gate electrode 113 of a thin film transistor on the first sub-dielectric layer 151, forming a second sub-dielectric layer 152 on the gate electrode 113, forming a conductive structure 24 on the second sub-dielectric layer, and forming a third sub-dielectric layer 153 on the conductive structure.

Figure 11C:
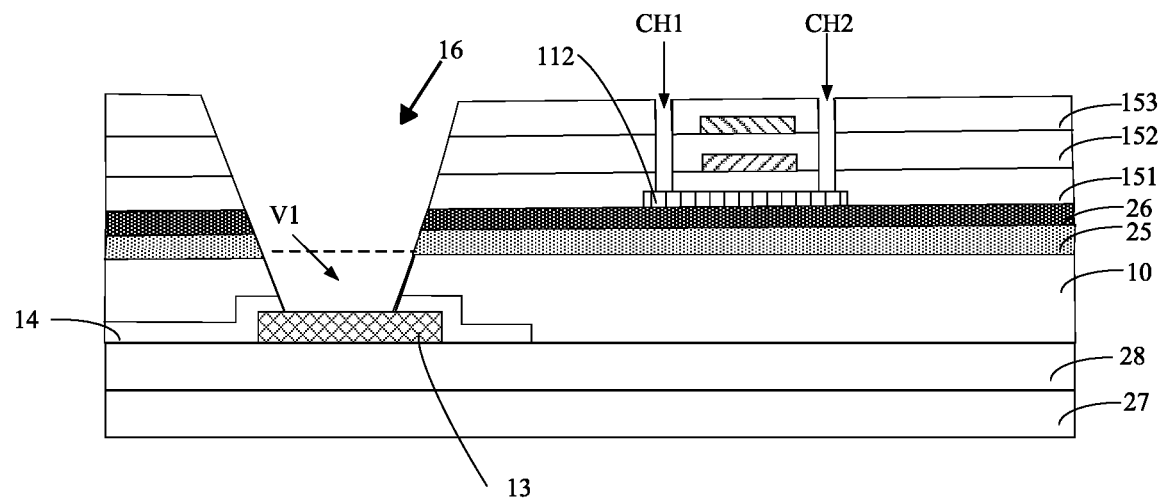

As shown in FIG. 11C, the method for manufacturing a display substrate according to an embodiment of the present disclosure further includes forming a first opening 16, a via V1, a first connection hole CH1, and a second connection hole CH2, for example, by etching. The first opening 16 passes through the first sub-dielectric layer 151, the second sub-dielectric layer 152, the third sub-dielectric layer 153, the buffer layer 26, and the barrier layer 25. The via V1 passes through the base substrate 10 and the first dielectric layer 14 and reaches an upper surface of the first conductive part 13. The first opening 16 and the via V1 can be formed by performing one to three times etching using the same mask. The first connection hole CH1 and the second connection hole CH2 pass through the first sub-dielectric layer 151, the second sub-dielectric layer 152 and the third sub-dielectric layer 153 and reaches an upper surface of the active layer 112.

Figure 11D:
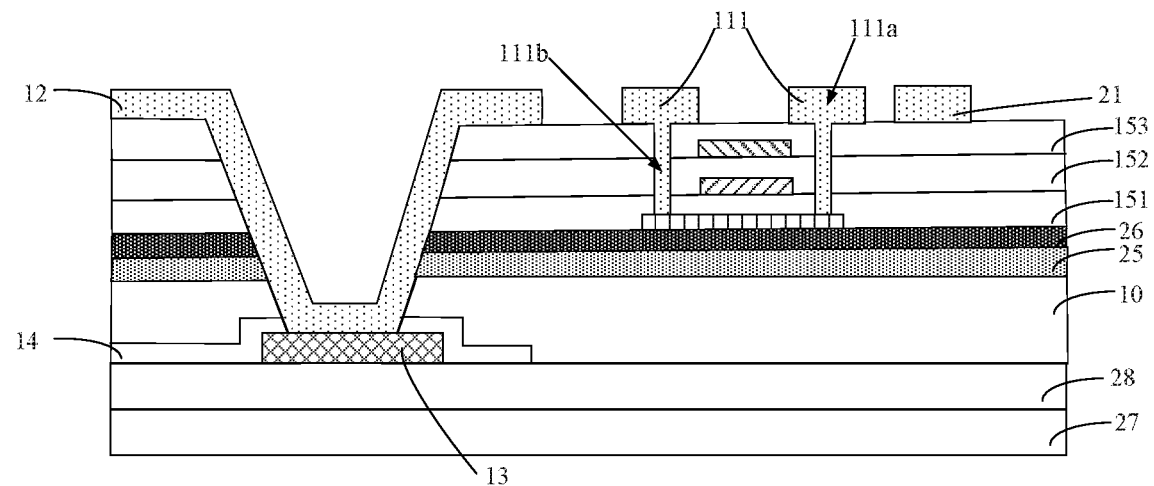

As shown in FIG. 11D, the method for manufacturing a display substrate according to an embodiment of the present disclosure further includes forming a first conductive structure 12, a source/drain electrode 111 of the thin film transistor, and a fourth conductive part 21 on the third sub-dielectric layer 153. In some embodiments, the first conductive structure 12, the source/drain electrode 111 of the thin film transistor, and the fourth conductive part 21 may be formed by a single film forming process. Specifically, a second material layer may be formed on the third sub-dielectric layer 153, and then the second material layer may be patterned (for example, etched) to form the first conductive structure 12, the source/drain electrodes 111 of the thin film transistor, and the fourth conductive part 21. The source/drain electrode 111 of the thin film transistor may include a first portion 111a on a side of the intermediate layer 15 away from the base substrate 10 and a second portion 111b passing through at least a portion of the intermediate layer 15 and reaching the active layer 112.

Figure 11E:
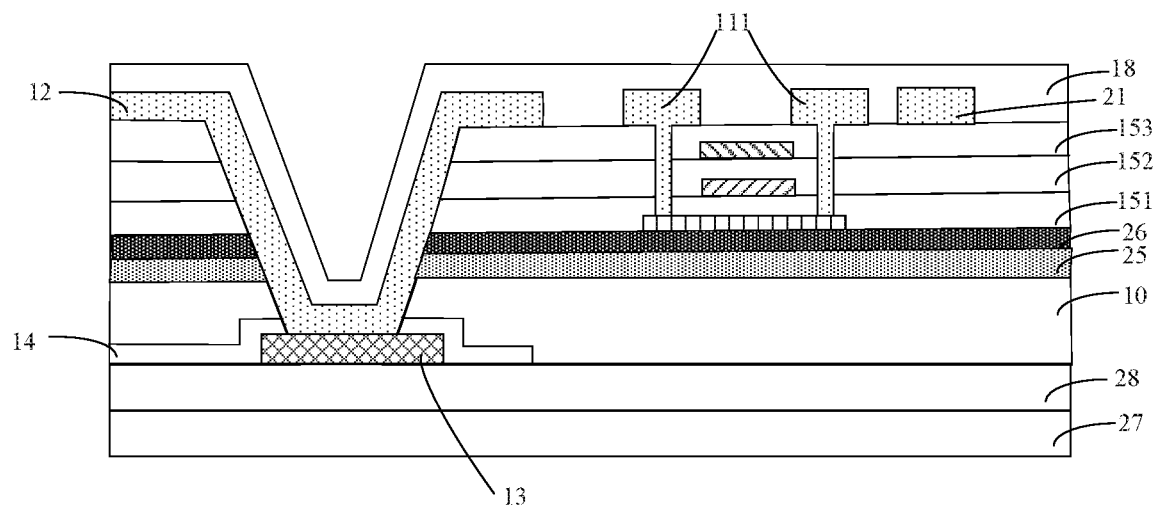

As shown in FIG. 11E, the method for manufacturing a display substrate according to an embodiment of the present disclosure further includes forming a second dielectric layer 18 on the first conductive structure 12, the source/drain electrode 111 of the thin film transistor, and the fourth conductive part 21.

Figure 11F:
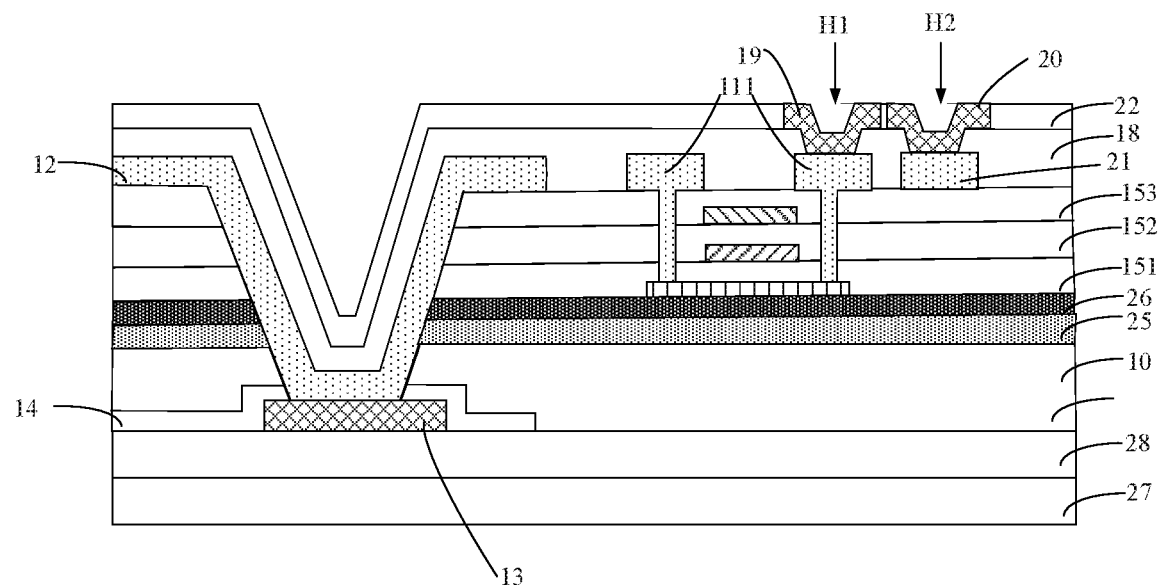

As shown in FIG. 11F, the method for manufacturing a display substrate according to an embodiment of the present disclosure further includes forming a first hole H1 and a second hole H2 in the second dielectric layer 18. The first hole H1 reaches an upper surface of the source/drain electrode 111. The second hole H2 reaches an upper surface of the fourth conductive part 21.

The method for manufacturing a display substrate according to an embodiment of the present disclosure further includes forming a second conductive part 19 in the first hole H1 and forming a third conductive part 20 in the second hole H2. The second conductive part 19 may be electrically connected to the source/drain electrode 111 through the first hole H1 located in the second dielectric layer 18. The third conductive part 20 may be electrically connected to the fourth conductive part 21 through the second hole H2.

The method for manufacturing a display substrate according to an embodiment of the present disclosure further includes forming a third dielectric layer 22 on the second dielectric layer 18. The third dielectric layer 22 may cover a side surface of the second portion 19 and a side surface of the third conductive part 20, thereby preventing these side surfaces from being oxidized.

Figure 11G:
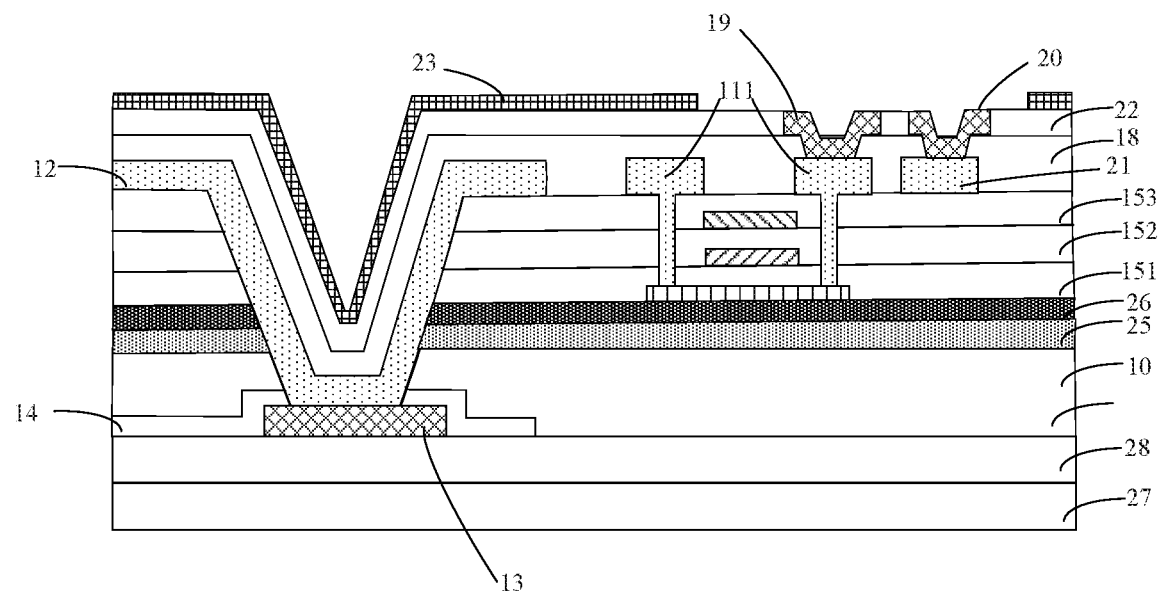

As shown in FIG. 11G, the method for manufacturing a display substrate according to an embodiment of the present disclosure further includes forming a light shielding pattern 23 on the third dielectric layer 22 (i.e., on a side of the third dielectric layer 22 away from the base substrate 10). An orthographic projection of the light shielding pattern 23 on the base substrate 10 at least covers an orthographic projection of the first conductive part 13 on the base substrate 10.

The method for manufacturing a display substrate according to an embodiment of the present disclosure may further include providing a light emitting element 17 above the first hole H1 and the second hole H2, wherein a first electrode 171 and a second electrode 172 of the light emitting element 17 are located in the first hole H1 and the second hole H2, respectively. The first electrode 171 may be electrically connected to the source/drain electrode 111 through the first hole H1. The second electrode 172 may be electrically connected to the fourth conductive part 21 through the second hole H2.

Figure 11H:
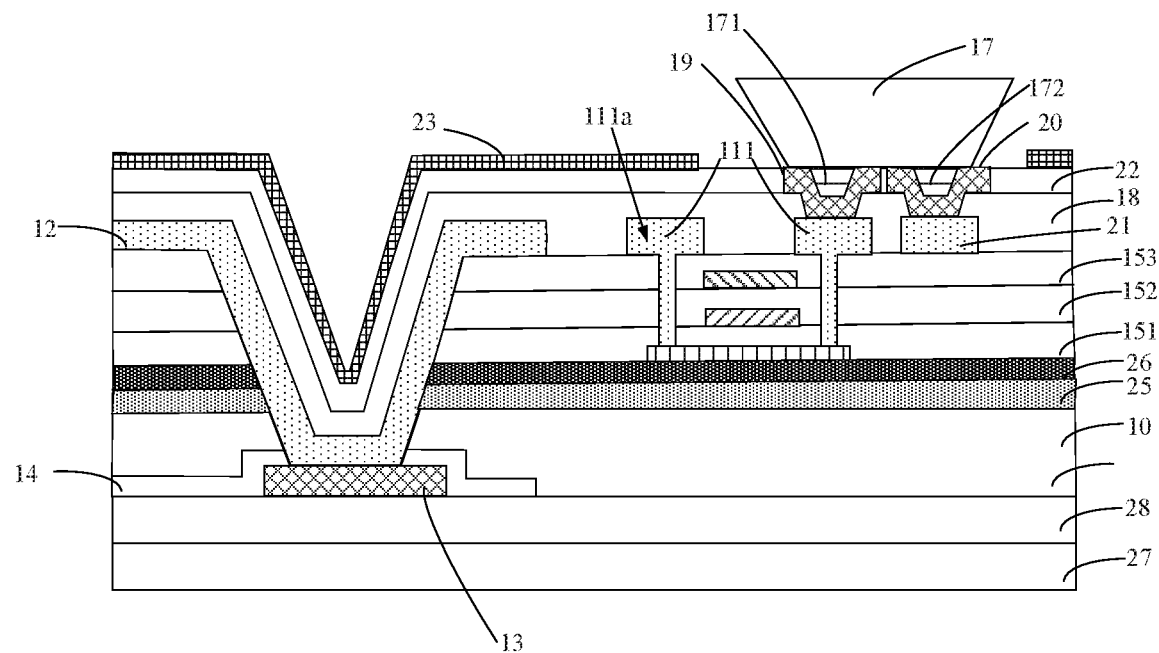

As shown in FIG. 11H, the method for manufacturing a display substrate according to an embodiment of the present disclosure may further include bonding the light emitting element 17. The light emitting element 17 may include a micro LED. The light emitting element 17 may also include other light emitting elements, for example, an LED, an organic light emitting diode (OLED), etc.

Figure 11I:
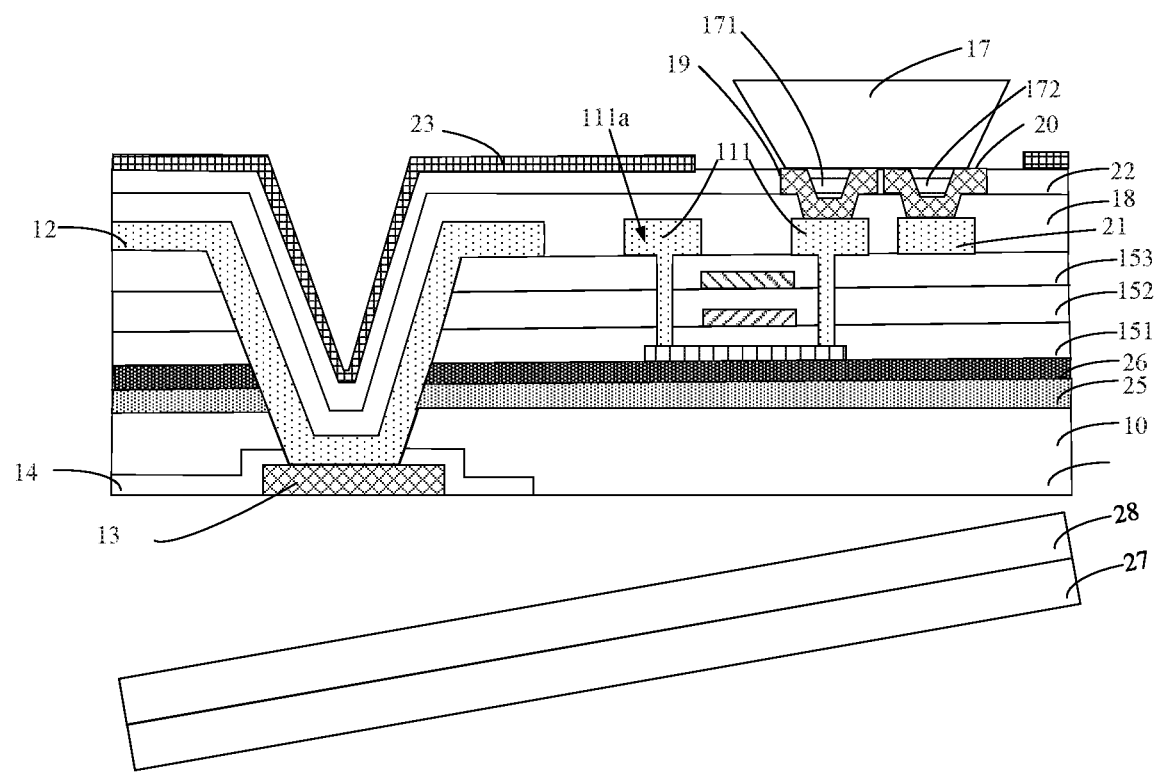

As shown in FIG. 11I, the method for manufacturing a display substrate according to an embodiment of the present disclosure may further include separating the sacrificial layer 28 from the base substrate 10. For example, a laser lift off (LLO) method may be used to separate the sacrificial layer 28 from the base substrate 10. Specifically, after high-energy irradiation of the LLO, the material of the sacrificial layer 28 will be decomposed, so that the sacrificial layer 28 is easily separated from the base substrate 10.

Figure 11J:
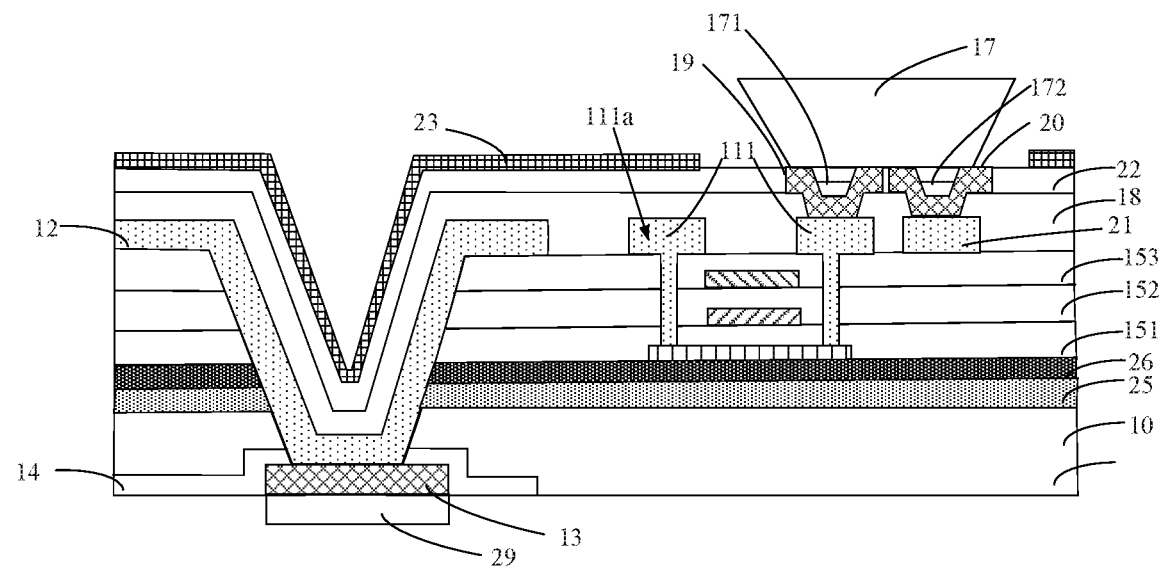

As shown in FIG. 11J, the method for manufacturing a display substrate according to an embodiment of the present disclosure may further include forming an integrated circuit 29 on the second side of the base substrate 10 opposite to the first side. The integrated circuit 29 is electrically connected to the first conductive part 13. The integrated circuit 29 may be used to control the operation of the display substrate, for example, to drive and control the display panel.

FIGS. 12A-12F are schematic views of a method for manufacturing a display substrate according to an embodiment of the present disclosure. Hereinafter, a method for manufacturing a display substrate according to some embodiments of the present disclosure will be described with reference to FIGS. 12A-12F, in which some details that are the same as those of the embodiments shown in FIGS. 11A-11J are omitted.

Figure 12A:
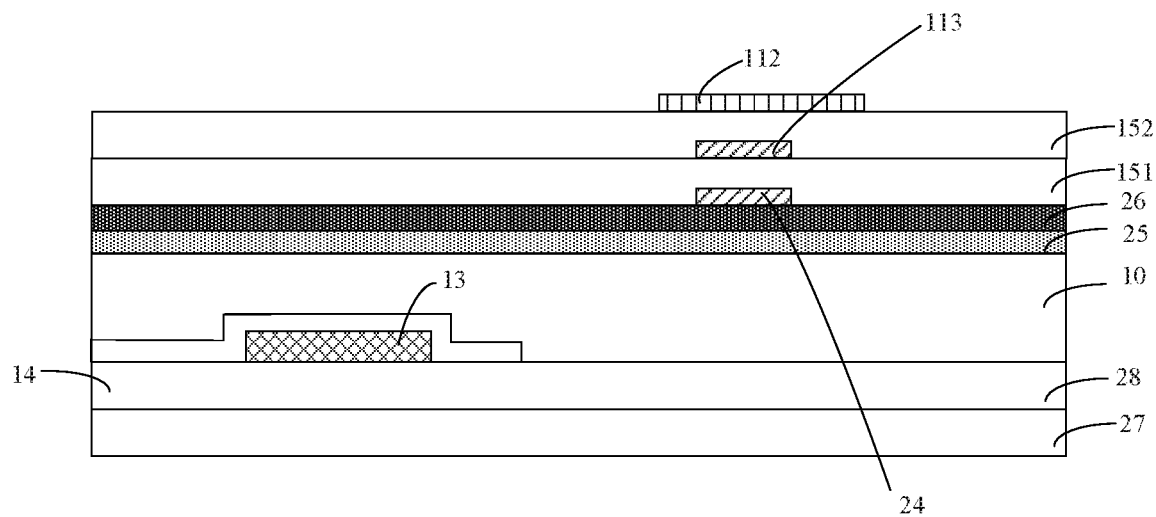
FIGS. 12A-12F are schematic views of a method for manufacturing a display substrate according to an embodiment of the present disclosure.

As shown in FIG. 12A, a method for manufacturing a display substrate according to an embodiment of the present disclosure includes forming a sacrificial layer 28 on a supporting substrate 27, forming a first conductive part 13 on the sacrificial layer 28, forming a first dielectric layer 14 on the first conductive part 13 to cover the first conductive part 13, forming an base substrate 10 on the first dielectric layer 14, forming a barrier layer 25 on the base substrate 10, forming a buffer layer 26 on the barrier layer 25, forming a conductive structure 24 on the buffer layer 26, forming a first sub-dielectric layer 151 on the conductive structure 24, forming a gate electrode 113 on the first sub-dielectric layer 151, forming a second sub-dielectric layer 152 on the gate electrode 113, and forming an active layer 112 on the second sub-dielectric layer 152. The conductive structure 24 may form a storage capacitor together with the gate electrode 113.

Figure 12B:
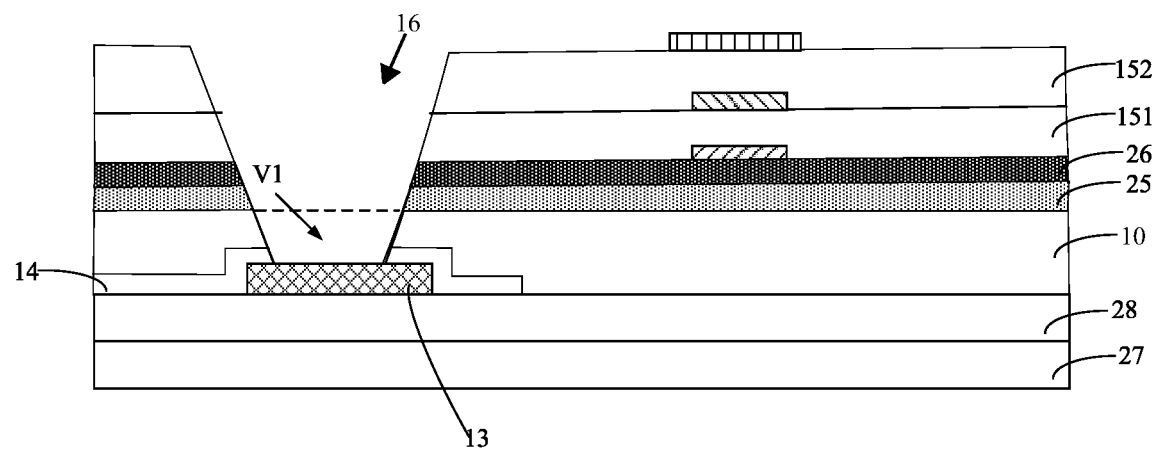

As shown in FIG. 12B, the method for manufacturing a display substrate according to an embodiment of the present disclosure may further include performing a patterning to form a first opening 16 and a via V1. The first opening 16 passes through the first sub-dielectric layer 151, the second sub-dielectric layer 152, the buffer layer 26 and the barrier layer 25. The via V1 passes through the base substrate 10 and the first dielectric layer 14 and reaches an upper surface of the first conductive part 13.

Figure 12C:
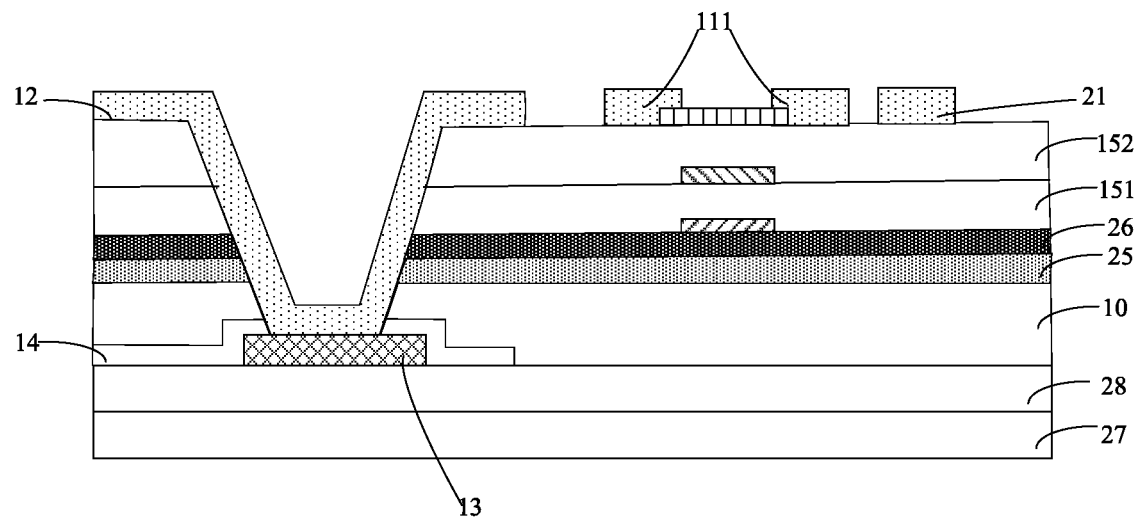

As shown in FIG. 12C, the method for manufacturing a display substrate according to an embodiment of the present disclosure may further include forming a first conductive structure 12, a source/drain electrode 111 of a thin film transistor, and a fourth conductive part 21 on the active layer 112 and the second sub-dielectric layer 152. The first conductive structure 12, the source/drain electrode 111 of the thin film transistor, and the fourth conductive part 21 may be formed by a single film forming process. Specifically, a second material layer may be formed on the second sub-dielectric layer 152, and then the second material layer is patterned (for example, etched) to form the first conductive structure 12, the source/drain electrode 111 of the thin film transistor, and the fourth conductive part 21.

Figure 12D:
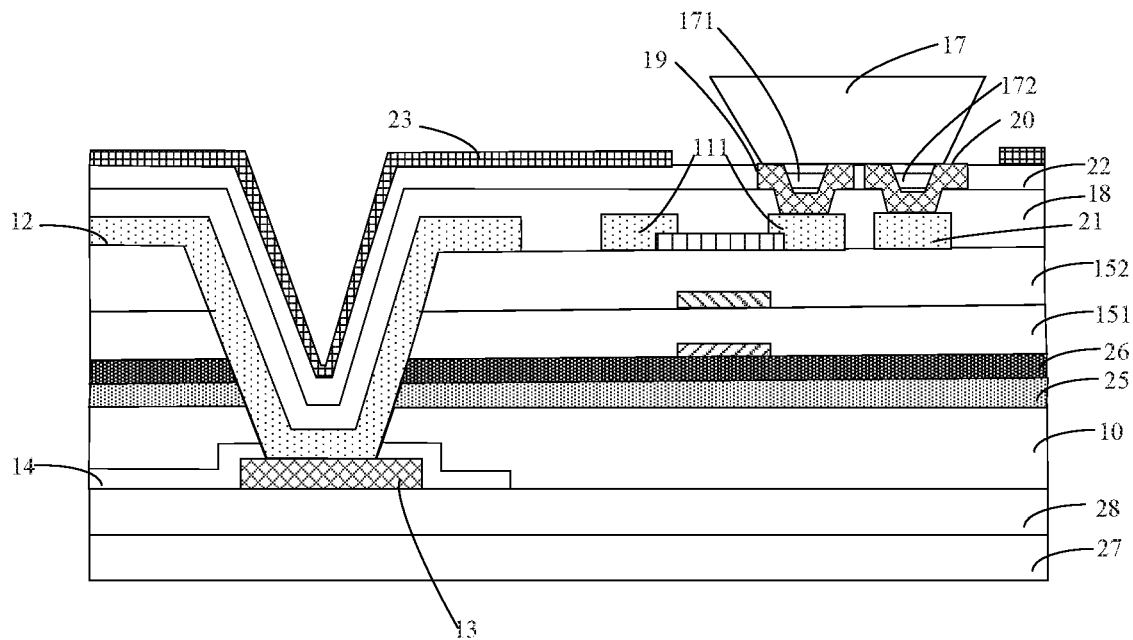

As shown in FIG. 12D, the method for manufacturing a display substrate according to an embodiment of the present disclosure may further include forming a second dielectric layer 18 on the first conductive structure 12, the source/drain electrode 111 of the thin film transistor, and the fourth conductive part 21. Then, a first hole H1 and a second hole H2 may be formed in the second dielectric layer 18. The first hole H1 reaches an upper surface of the source/drain electrode 111. The second hole H2 reaches an upper surface of the fourth conductive part 21. Further, a second conductive part 19 may be formed in the first hole H1 and a third conductive part 20 may be formed in the second hole H2. Further, a third dielectric layer 22 can further be formed on the second dielectric layer 18. Next, a light shielding pattern 23 may be formed on the third dielectric layer 22. The method for manufacturing the display substrate may further include providing a light emitting element 17 above the first hole H1 and the second hole H2, wherein a first electrode 171 and a second electrode 172 of the light emitting element 17 are located in the first hole H1 and the second hole H2, respectively.

Figure 12E:
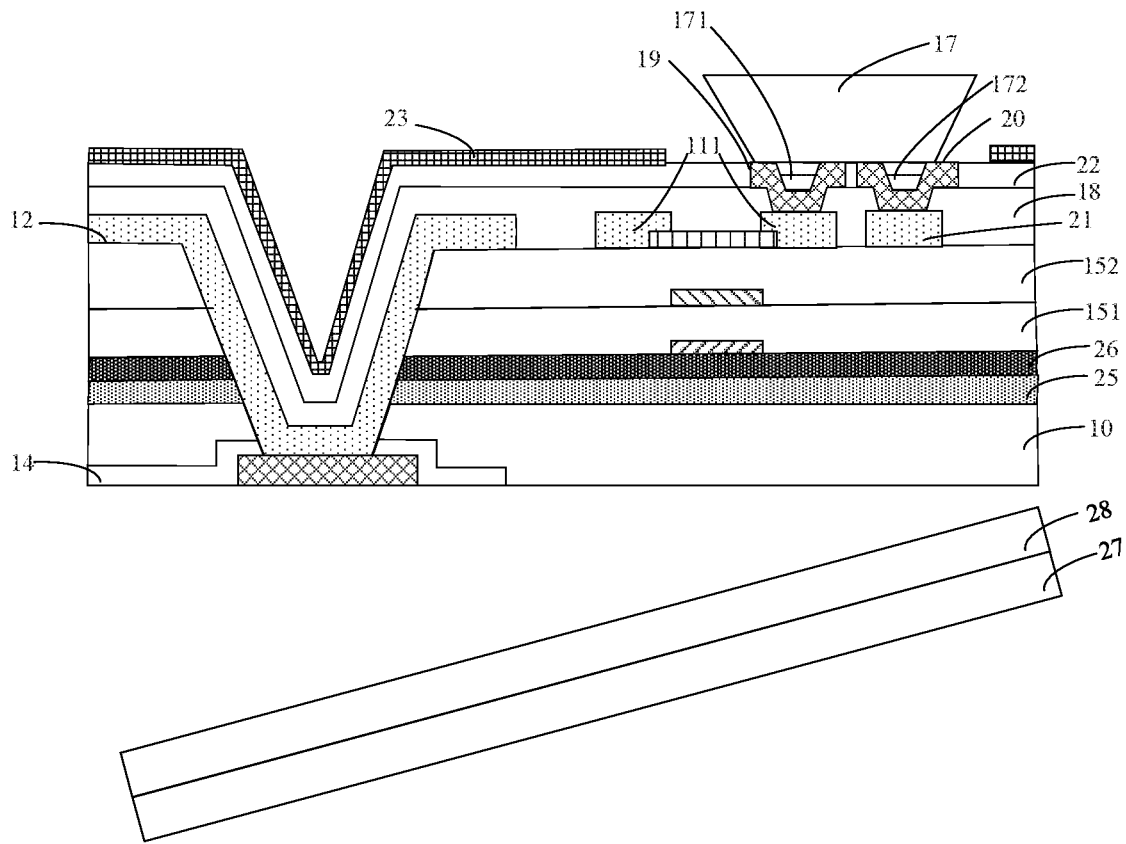

As shown in FIG. 12E, the method for manufacturing a display substrate according to an embodiment of the present disclosure may further include separating the sacrificial layer 28 from the base substrate 10. For example, a laser lift off method may be used to separate the sacrificial layer 28 from the base substrate 10. The use of the sacrificial layer can solve the problem that the base substrate 10 (for example, a flexible base substrate such as PI) is difficult to be peeled from the supporting substrate (for example, a rigid base substrate such as glass).

Figure 12F:
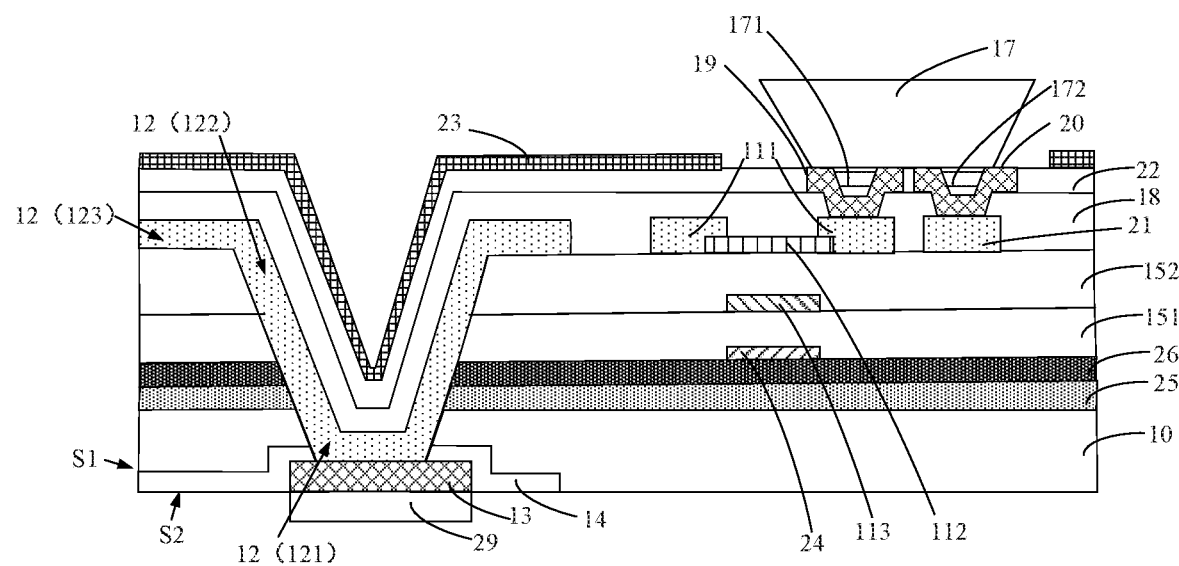

As shown in FIG. 12F, the method for manufacturing a display substrate according to an embodiment of the present disclosure may further include forming an integrated circuit 29 on the second side of the base substrate 10 opposite to the first side. The integrated circuit 29 is electrically connected to the first conductive part 13. The integrated circuit 29 can be used to provide driving and control signals to the display substrate.

In some technical solutions, a via provided in a base substrate such as polyimide needs to be deliberately filled with organic material to fill up the via, and the organic material filled in the via needs to undergo high temperature processing (for example, high temperature is experienced when forming the active layer and source/drain electrode by using the LTPS process). However, the thermal stability of the organic material is poor, which causes that the organic material filling the via easily lead to film bursting when undergoing a high temperature process. For some embodiments of the present disclosure, there is no need to deliberately apply the above-mentioned organic materials in the via. Therefore, film bursting can be avoided and the performance of the display substrate can be improved.

Certain specific embodiments have been described, and these embodiments are only shown by way of example and are not intended to limit the scope of the present disclosure. In fact, the novel embodiments described herein can be implemented in various other forms. In addition, various omissions, substitutions, and changes in the form of the embodiments described herein can be made without departing from the spirit of the present disclosure. The appended claims and their equivalents are intended to cover such forms or modifications that fall within the scope and spirit of the present disclosure.

What is claimed is:

1. A display substrate comprising:
   a base substrate having a first side and a second side opposite to the first side;
   a via provided in the base substrate;
   a thin film transistor provided on the first side of the base substrate;
   a first conductive structure provided on the first side of the base substrate, wherein a first sub-portion of the first conductive structure is located in the via, and wherein a material of the first conductive structure is the same as a material of a source/drain electrode of the thin film transistor;
   a second dielectric layer, wherein the second dielectric layer covers the source/drain electrode and the first conductive structure, and wherein the second dielectric layer extends into the via in the base substrate;
   a second conductive portion, wherein the second conductive portion is electrically connected to the source/drain electrode through a via-hole located in the second dielectric layer;
   a third dielectric layer, wherein the third dielectric layer covers at least a side surface of the second conductive portion, and wherein the third dielectric layer extends into the via in the base substrate; and
   a light shielding pattern, wherein the light shielding pattern is located on a side of the third dielectric layer away from the base substrate, and wherein the light shielding pattern extends into the via in the base substrate.

2. The display substrate according to claim 1, further comprising a first conductive part, the first conductive part at least partially located in the via and directly contacting the first sub-portion of the first conductive structure.

3. The display substrate according to claim 2, wherein a surface of the first conductive part away from the first side of the base substrate is coplanar with the second side.

4. The display substrate according to claim 3, further comprising a first dielectric layer located between the base substrate and the first conductive part, wherein a surface of the first dielectric layer away from the base substrate is coplanar with the second side.

5. The display substrate according to claim 3, further comprising:
   an intermediate layer; and
   a first opening penetrating the intermediate layer and communicating with the via,
   wherein a second sub-portion of the first conductive structure at least partially covers a sidewall of the first opening, and wherein a third sub-portion of the first conductive structure is located on a surface of the intermediate layer away from the base substrate.

6. The display substrate according to claim 5, wherein the source/drain electrode of the thin film transistor is provided in a same layer as at least the third sub-portion of the first conductive structure.

7. The display substrate according to claim 6, further comprising a light emitting element comprising a first electrode and a second electrode, wherein one of the first electrode and the second electrode is electrically connected to the source/drain electrode.

8. The display substrate according to claim 1, further comprising an integrated circuit provided on the second side of the base substrate, wherein the integrated circuit is electrically connected to the first conductive part.

9. A display device comprising the display substrate according to claim 1.

10. A method for manufacturing a display substrate, the method comprising:
    providing a base substrate;
    forming a via in the base substrate;
    forming a first conductive structure and a thin film transistor on a first side of the base substrate, wherein a first sub-portion of the first conductive structure is located in the via, and wherein the first conductive structure and a source/drain electrode of the thin film transistor are manufactured by a single film forming process;
    forming a second dielectric layer, wherein the second dielectric layer covers the source/drain electrode and the first conductive structure, and wherein the second dielectric layer extends into the via;

forming a second conductive portion, wherein the second conductive portion is electrically connected to the source/drain electrode through a via-hole located in the second dielectric layer;

forming a third dielectric layer, wherein the third dielectric layer covers at least a side surface of the second conductive portion, and wherein the third dielectric layer extends into the via; and forming a light shielding pattern, wherein the light shielding pattern is located on a side of the third dielectric layer away from the base substrate, wherein an orthographic projection of the first conductive structure on the base substrate falls within an orthographic projection of the light shielding pattern on the base substrate, and wherein the light shielding pattern extends into the via.

11. The method according to claim 10, wherein providing the base substrate comprises:
providing a supporting substrate;
providing a sacrificial layer on the supporting substrate;
forming a first conductive part on the sacrificial layer;
forming a first dielectric layer to cover the first conductive part and the sacrificial layer; and
applying a first material on the first dielectric layer to form the base substrate.

12. The method according to claim 11, further comprising:
forming an intermediate layer on the base substrate,
wherein forming the via in the base substrate comprises:
forming a hole passing through the intermediate layer and the base substrate to expose a surface of the first conductive part.

13. The method according to claim 12, wherein forming the first conductive structure comprises:
forming a conductive material layer on the intermediate layer; and
performing a patterning process on the conductive material layer to form the first conductive structure and the source/drain electrode.

14. A display device comprising the display substrate according to claim 2.

15. A display device comprising the display substrate according to claim 3.

16. A display device comprising the display substrate according to claim 4.

17. The display substrate according to claim 1, wherein an orthographic projection of the first conductive structure on the base substrate falls within an orthographic projection of the light shielding pattern on the base substrate.

* * * * *